United States Patent [19]
Peyton

[11] Patent Number: 5,091,821
[45] Date of Patent: Feb. 25, 1992

[54] PROTECTIVE COVER FOR ELECTRICAL ASSEMBLY UNIT

[76] Inventor: Thomas B. Peyton, 216 Drake Ave., Oneida, N.Y. 13421

[21] Appl. No.: 512,966

[22] Filed: Apr. 23, 1990

[51] Int. Cl.⁵ .......................... H02B 1/00; H01R 9/00; H02G 3/18
[52] U.S. Cl. .................................. 361/380; 361/426; 174/60
[58] Field of Search ............... 361/380, 332, 333, 334, 361/356, 358, 428, 426, 429; 174/59, 60; 379/326, 328, 329

[56] References Cited

U.S. PATENT DOCUMENTS

| | | |
|---|---|---|
| Re. 29,371 | 8/1977 | De Bortoli et al. ............... 174/60 |
| 1,784,253 | 12/1930 | Schano . |
| 2,584,173 | 2/1952 | Van Fowler . |
| 3,020,511 | 2/1962 | Raver . |
| 3,101,225 | 8/1963 | Penningroth . |
| 3,299,323 | 1/1967 | Dudley . |
| 3,634,732 | 1/1972 | Finger et al. . |
| 4,227,237 | 10/1980 | Matthews et al. . |
| 4,414,576 | 11/1983 | Randmae . |
| 4,679,728 | 7/1987 | Gregory . |
| 4,782,427 | 11/1988 | Marks ................................ 361/426 |
| 4,932,051 | 6/1990 | Karan et al. ...................... 379/399 |
| 4,975,072 | 12/1990 | Afshar ................................ 439/131 |

*Primary Examiner*—Leo P. Picard
*Assistant Examiner*—Bot Lee Ledynh
*Attorney, Agent, or Firm*—D. Peter Hochberg; Mark Kusner; Louis J. Weisz

[57] ABSTRACT

A detachable protective cover for an electrical terminal block comprising a pivot member top whose sides are pivotally attached by pins to support members connected to the terminal block with fasteners. The pivot member top overlays the block in the cover's closed position, but can be pivoted forward to expose the block in the cover's open position. In a preferred embodiment when the block is mounted horizontally on a distributing frame, the pivot member top can pivot forward and downwardly to an angle from the horizontal so as to preclude interference with a ladder associated with the frame when the ladder is positioned in front of an open cover.

9 Claims, 6 Drawing Sheets

PROTECTIVE COVER FOR ELECTRICAL ASSEMBLY UNIT

TECHNICAL FIELD

This invention relates to a protective cover assembly, or shroud, for electrical assembly units. More particularly, this invention relates to a cover or shroud assembly for electrical terminal blocks that move between a closed mode, providing protection for the blocks, to an open mode, which allows access thereto. Specifically, this invention relates to a protective cover assembly for electrical assembly units such as terminal blocks, which includes a mounting member for fastening the cover to an assembly unit, and a covering pivot member pivotally attached to the mounting member which can be positioned to provide access to the assembly unit, or to provide covering protection for the unit.

BACKGROUND OF THE INVENTION

Frequently, assemblies of electronic components providing similar or identical functions are fabricated in modular units and located together in groups, for example in switch rooms, in order to facilitate the adjustment, testing, and repair of the assembly units, or their replacement as required. Typical of such units are component assemblies referred to as "terminal blocks" which, depending upon the contained components and wiring mode, are used for current attenuation through included resistor elements; the generation of "sealing currents" which protect against corrosion by provision of a low amperage current; for the bridging connection of selected circuits, as well as other uses. Terminal blocks are widely employed in areas such as telecommunication, data transmission, power and utility distribution, for transmitting broadcast audio, and in a variety of additional areas. Very often, the sheer number of module located together results in space constraints which necessitate a high density arrangement of the units. Commonly this is accomplished by positioning the units in vertical, adjacent stacks, one over the other utilizing frame-like racks termed "distributing frames," which are positioned in parallel rows in the switch room. Sufficient vertical space is provided between the modules to allow access, particularly from the top, so that required procedures may be performed on the units.

In such arrangements the vertical stacks are typically so high, often eleven feet or higher, that a movable ladder must be provided, suspended from a supporting rail positioned parallel to, and in front of the distributing frames. In the case of assembly units located too high to be conveniently reached from the floor, the ladder is moved along the rail to the stack in which the assembly unit of interest is located, providing access to the unit.

While positioning of the modular assembly units as described results in economies of space, their close proximity makes their contained components vulnerable to damage. In the case of terminal blocks, for example, electric cables containing wires required for attachment to pins within the blocks are pulled along behind the rows, frequently resulting in injury to the contained components, especially to electrical connection pins located therein, when the blocks are uncovered. The pins can also be injured by the shoes of workers climbing the ladders, and uncovered pins provide a safety hazard to workers. Furthermore, while uncovered electrical assemblies positioned over each other in distribution frames are easier to work on than covered assemblies so positioned, uncovered lower assemblies are vulnerable to debris such as pieces of solder falling into them as a result of work on higher assemblies. Such contamination can easily result in electrical shorting of the components making up an assembly, leading to destructive damage and malfunction. In addition, uncovered assembly units tend to accumulate dirt, dust and other material adventitiously entering the assemblies, likewise involving the risk of damage to the units.

Although some electronic assembly units are provided with covers to protect their interiors, the removal of covers can involve the removal of fasteners, a relatively arduous task particularly in the cramped confines typically encountered in frames of the type described. In the case of another type of cover, velcro fasteners are provided to simplify removal and replacement of the covers; however, experience has shown that the covers frequently fall or are thrown to the floor, resulting in damage to them, and that they are never replaced.

It has also been proposed to provide hingeable protective cover structures, designed to allow access to housed electronic components. Such devices are shown, for example, in U.S. Pat. No. 3,299,323, which teaches a hinged cover attached to a box-like cabinet containing electrical chassis, and in U.S. Pat. No. 3,634,732, which illustrates a cabinet for housing electronic components such as printed circuits, and which includes a hinged cover member.

The hinged covers taught in the preceding patents are unsuitable for accessing the components in closely spaced assembly units from the top, however, particularly where the distributing frames holding the assembly units require a ladder closely positioned to the frames to reach the higher assembly units.

DISCLOSURE OF THE INVENTION

In view of the preceding, therefore, it is a first aspect of this invention to provide a protective cover for electrical assembly units.

A second aspect of this invention is to provide a protective cover for electrical terminal blocks that protects such blocks supported in a rack-like frame.

A further aspect of this invention is to furnish a pivotable cover which can be pivoted to a position providing access to the top of an electrical terminal block, or to a position providing protection to the block.

An additional aspect of this invention is to provide a pivotable cover for an electrical terminal block in a distributing frame that pivots to an angular position that prevents interference with an access ladder associated with the distributing frame.

Another aspect of this invention is to provide a pivotable protective cover that can be retrofitted to electrical terminal blocks that are supported in an existing distributing frame, located in a spacelimited environment.

Still another object of this invention is to provide a protective cover having a pivotable top member, and mounting members in which the top member is automatically aligned and latched when moved to its closed position.

A still further object of this invention is to furnish a protective cover having a top member which pivots to an open position due to the force of gravity after being pivoted beyond its center of gravity.

The preceding and other aspects of the invention are provided by a protective cover for attachment over an electrical assembly unit to protect the internal components thereof, said unit having substantially vertical planar side, front, and rear panels in rectangular relationship to each other, and having upper and lower surface, said cover comprising components which include:

a pair of elongated, parallel, planar mounting members, each of which is mounted on said unit substantially parallel with and adjacent opposite ones of said side panels, and a pivot member, said mounting members including:

a first inwardly extending flange at the rear thereof, having a first aperture extending therethrough dimensioned to receive fastener means for securing said mounting members to said rear panel;

a second inwardly extending flange disposed along the lower edge of each of said mounting members, and an inwardly extending pin adjacent to the front of each of said mounting members, said pins being co-axial with each other, said pivot member having a generally planar top portion dimensioned to overlay the upper surface of said unit, and planar sidewalls extending downwardly therefrom parallel to said mounting members and to said side panels, and having a second aperture therein positioned and dimensioned to receive said pins, said pivot member being pivotable about said pins between an open position facilitating access to said internal components of said unit, and a closed position providing protection for said components in which the lower edge of said sidewalls rests on said second flange of said mounting members.

The foregoing and additional aspects of this invention are provided by a plastic protective cover for attachment over an electrical terminal block assembly to protect the internal components thereof, said assembly having substantially vertical planar side, front, and rear panels in rectangular relationship to each other, and upper and lower surfaces, said cover comprising components which include:

a pair of elongated, parallel, planar mounting members each of which is mounted on said assembly substantially parallel with and adjacent opposite ones of said side panels, and a pivot member, said mounting members including:

a first inwardly extending flange at the rear thereof, having a first aperture extending therethrough dimensioned to receive fastener means for securing said mounting members to said rear panel;

a second inwardly extending flange disposed along the lower edge of said mounting members, and an inwardly extending pin adjacent to the front of each of said mounting members, said pins being co-axial with each other, said pivot member having a generally planar top portion dimensioned to overlay the upper surface of said assembly, and planar sidewalls extending downwardly therefrom parallel to said mounting members and to said side panels, and having a second aperture therein positioned and dimensioned to receive said pins, said pivot member being pivotable about said pins between an open position in which when said assembly is positioned horizontally, said top portion extends downwardly at an angle from the horizontal, thereby facilitating access to said internal components of said assembly, and a closed position providing protection for said components in which the lower edge of said sidewalls rests on said second flange of said mounting members.

BRIEF DESCRIPTION OF THE DRAWINGS

The invention will be better understood when reference is had to the following drawings, in which like-numbers refer to like-parts, and wherein.

DETAILED DESCRIPTION OF THE INVENTION

Figure 1:
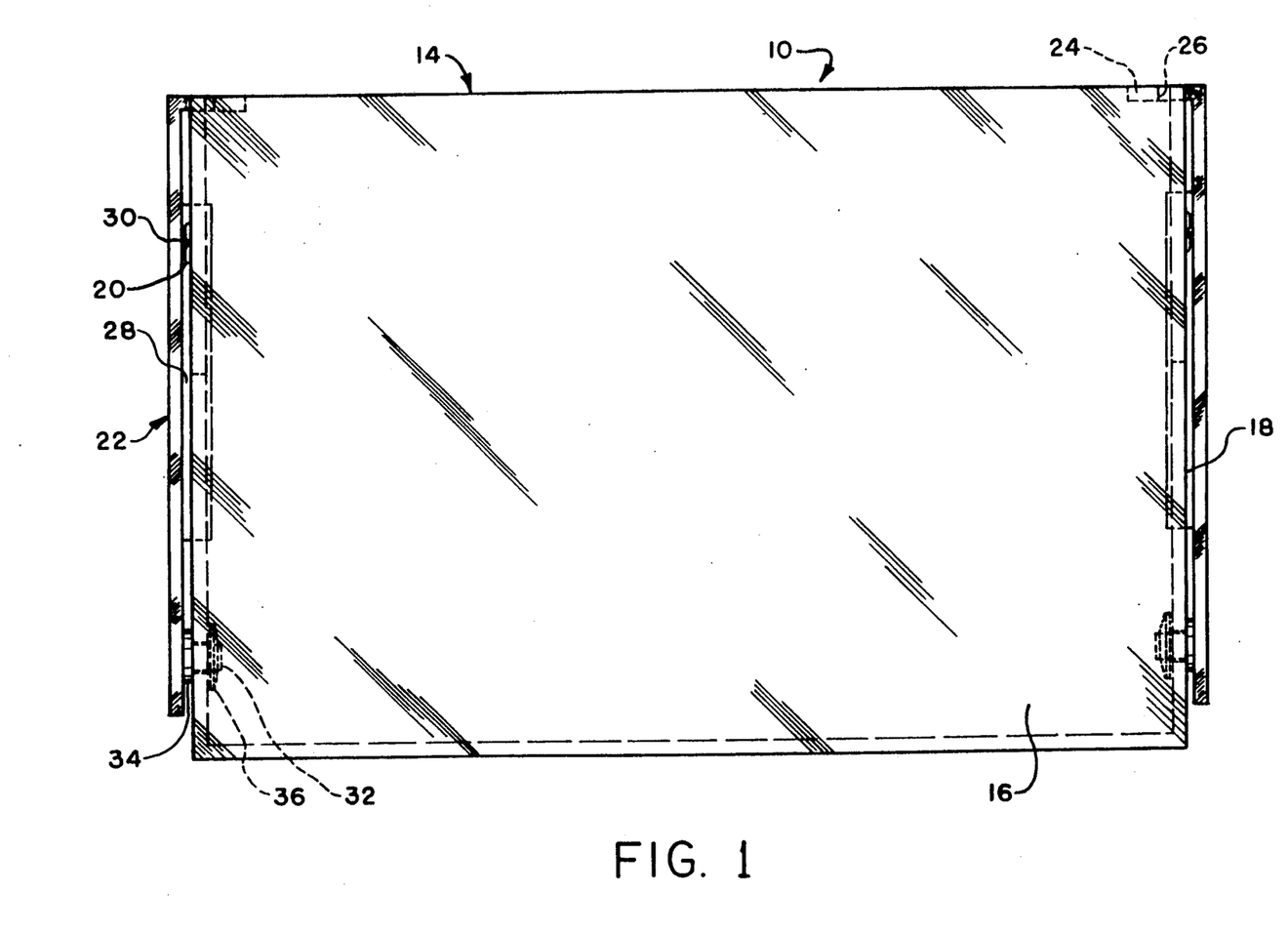
FIG. 1 is a plan view of a protective cover of the invention.

FIG. 1 is a plan view of a protective cover of the invention, generally 10. The Figure shows the pivot member, generally 14, attached to mounting members, generally 22. The pivot member comprises a pivot member top 16, and pivot member sides 18, the latter resting on support flanges 28, extending from the mounting members 22. The mounting members are connected to the pivot member by means of pivot pins 32 extending through the pivot member sides 18, the pins being attached to a pin boss 34 extending from the mounting members. A speed nut 36, positioned on the pivot pins 32 holds the pivot member securely to the mounting members. The pivot member 14 is latched to mounting members 22 when the protective cover is in its closed mode, as shown, by means of the latch detent 30 extending from the side of the mounting members 22, which engages a latch tab 20, extending from the pivot member sides. Attachment of the protective cover to a distributing frame, not shown, is by means of fasteners extending through fastener apertures 26 contained in attachment flanges 24 at the rear of the cover.

The dimensions of the protective cover 10 will, naturally, depend upon the terminal block to be covered. Such terminal blocks typically come in widths of about 8 inches and 16 inches, although other dimensions could be employed. The blocks, including the front and rear panels, are usually about 5¼ inches deep and vary in height from about 3¼ inches at the front panel, to about 2½ inches at the rear panel.

The protective cover in the case of an 8 inch terminal block, described above, will normally include a pivot member having a top about 7½ inches wide and 5¼ inches deep, provided with sides approximately 2¾ inches high. When the components of the protective cover are formed from plastic, they will commonly have a thickness of about 3/16 inch.

The mounting members 22 associated with a pivot member dimensioned as described, will be provided with an attachment flange 24 about ½ inch wide, and with a shelf flange 28 approximately ¼ inch wide and 2½ inches long, although such dimensions may vary.

The protective cover 10 may be formed from a variety of materials, but desirably will be made from relatively rigid materials exhibiting substantial dielectric properties. Particularly preferred are the high impact plastics such as ABS, polystyrene, a polycarbonate, and equivalent materials.

Figure 2:
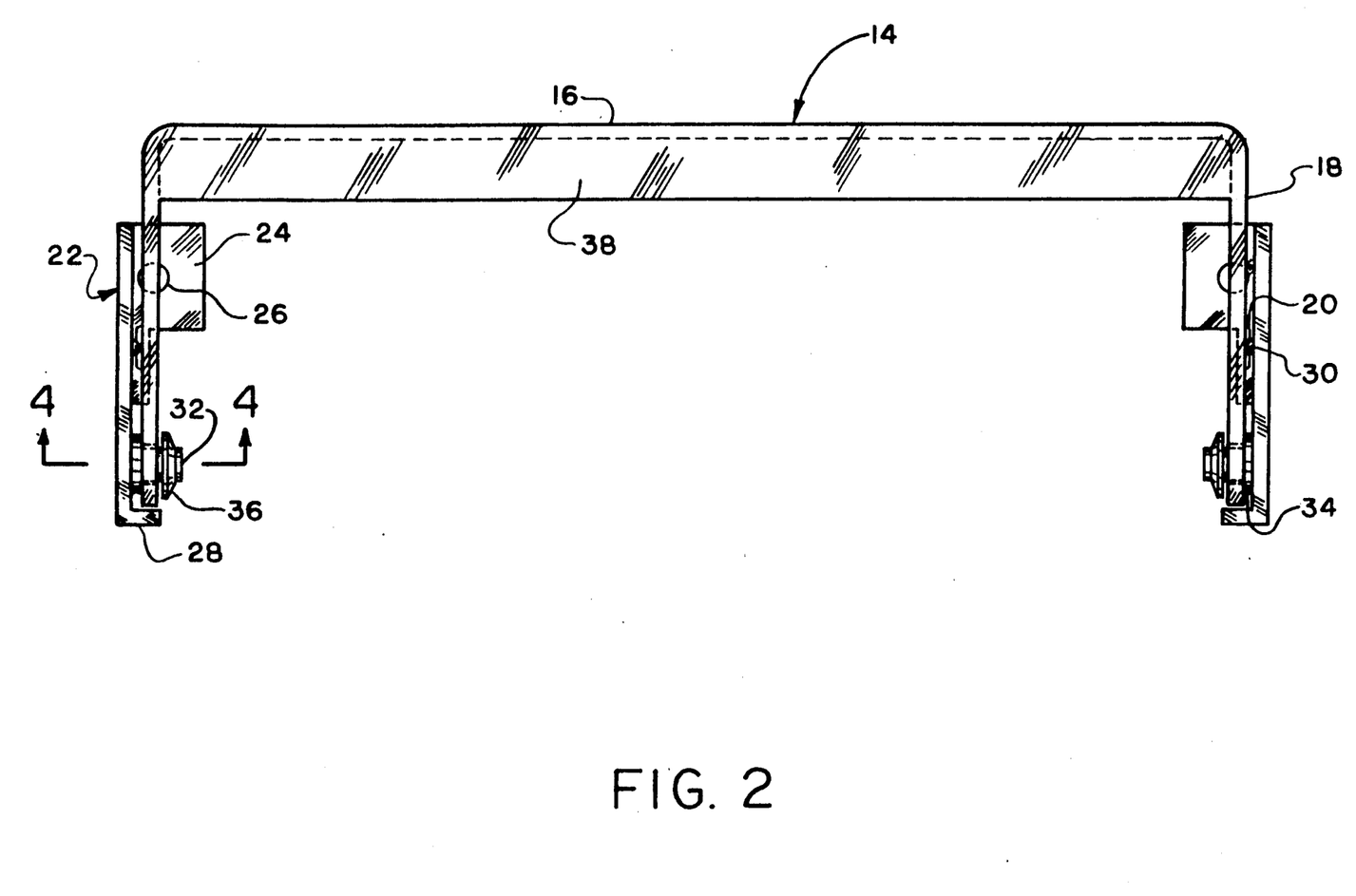
FIG. 2 shows a front elevation of the protective cover of FIG. 1.

FIG. 2 shows a front elevation of the protective cover of FIG. 1. As shown, the pivot member 14, including its component top 16 and sides 18 is pivotally connected to and supported by mounting members 22, specifically, by pivot pins 32 extending from pivot boss 34 connected to the mounting members, which together with speed nuts 36 lock the protective cover assembly together. Further details of the attachment flange 24, including fastener aperture 26, are disclosed by the figure. The engaging contact of latch detent 30 with latch tab 20 is also shown, as is a pivot member reinforcing flange 38.

The height of the reinforcing flange 38 will depend among other things upon the width of the pivot member top 16; however, it will commonly be in the order of ½ inch high. In addition to normally being about ½ inch wide, as previously described, the attachment flange 24 will ordinarily be about ¾ inch high, and where a bolt or similar fastener is used for attachment purposes, it will be provided with an aperture hole usually about ⅛ inch in diameter.

Figure 3:
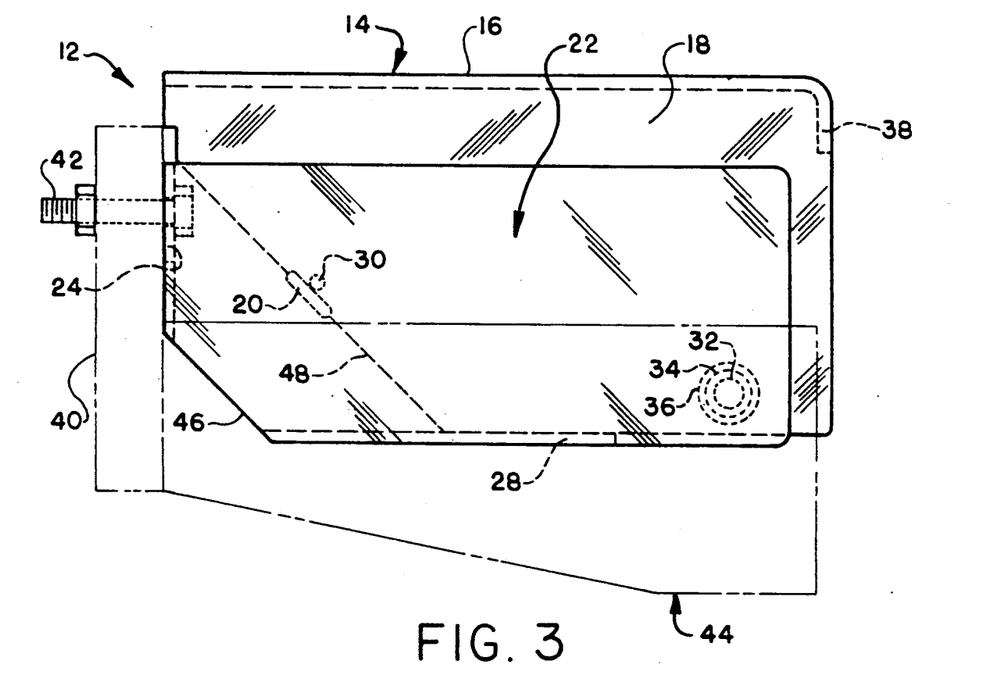
FIG. 3 is a side elevation of the protective cover of FIG. 1 attached to a terminal block shown in phantom.

FIG. 3 is a side elevation of the protective cover of FIG. 1 attached to a terminal block shown in phantom. The figure illustrates a terminal block with protective cover, generally 12, and including a pivot member 14 which includes a top member 16, side members 18, and a reinforcing flange 38, the pivot member being attached to mounting members 22. Each of the latter members includes attachment flange 24, and support flange 28, and is connected to pivot member 14 by means of pivot pin 32 extending from pin boss 34, the connecting assembly being secured by speed nut 36. In the cover closed mode shown, latch detent 30 extending from each of the mounting members 22, secures latch tab 20, extending from pivot member side 18, latching the pivot member to the mounting member. The mounting members 22 are fastened to the rear or mounting panel 40 of the terminal block, generally 44, by means of mounting fasteners 42, which extend through attachment flanges 24 and the rear panel. Although not necessary, both the pivot member sides 18, and mounting member 22 may be provided with chamfers 48 and 46, respectively.

The dimensions of the mounting members 22 may be varied, depending upon the dimensions of the terminal block and the requirements of the distributing frame; however, with respect to the components previously described, the mounting members will normally be about 5 inches long and 2¼ inches high.

The location of pivot pins 32, again will depend upon the dimensions of the components with which they are associated, and they will be positioned so that the pivot member 14 will be able to provide protection to the interior of the terminal block 44 when arranged in its closed position, while being able to swing freely forward to an angle downward from the horizontally positioned mounting members 22, as is more particularly described in the following. With respect to the components having dimensions as indicated, the pins will normally be located about ½ inch from the front and lower edges, respectively, of mounting members 22.

As can be seen from the Figure, the latches securing the pivot members to the mounting member are of the "snap-lock" type in which a detent located on one member presses against a tab located on the adjacent member, preventing separation of the members until one or the other is deformed slightly by pressure applied thereto, preventing the detent and tab from interfering with each other. As shown in FIG. 3, detent 32 and tab 20 are located on the respective members so that in the latched position, the bottom edge of the pivot member sides 18 rests on support flanges 28 of mounting members 22.

If desired, the edges, for example, the edge at which reinforcing flange 38 meets the pivot member top 16 may be rounded to provide a more pleasing appearance to the protective cover.

Figure 4:
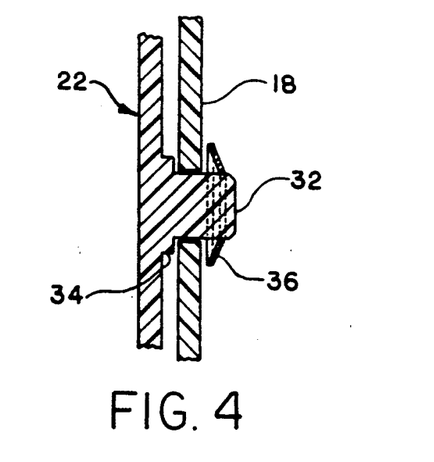
FIG. 4 shows a cross-section of one type of pivot pin used by a protective cover of the invention.

FIG. 4 shows a cross-section of one type of pivot pin used by a protective cover of the invention. As shown, mounting member 22 has formed as a part thereof a pin boss 34 from which pivot pin 32 extends. A pivot member side 18 is provided with an aperture hole through which the pin extends, and a speed nut 36 is positioned on the pin to secure the members together. While other dimensions are possible, with components having the dimensions indicated, it has been found convenient to use pins having a diameter of about ¼ inch, associated with a pin boss about ⅜ inch in diameter, the purpose of the boss being to space the pivot member from the mounting member, reducing friction therebetween.

Advantageously, the pin 32 forms part of the mounting member 22. However, the pivot end mounting members may be connected by other than a pin, for example, by a bolt, rivet, screw, or other fastener. In addition, while the embodiment illustrated shows the use of a speed nut for preventing separation of the pin from the aperture provided in the pivot member side, other means might also be used, for example, the end of the pin could be flattened, as in the case of a rivet.

Figure 5:
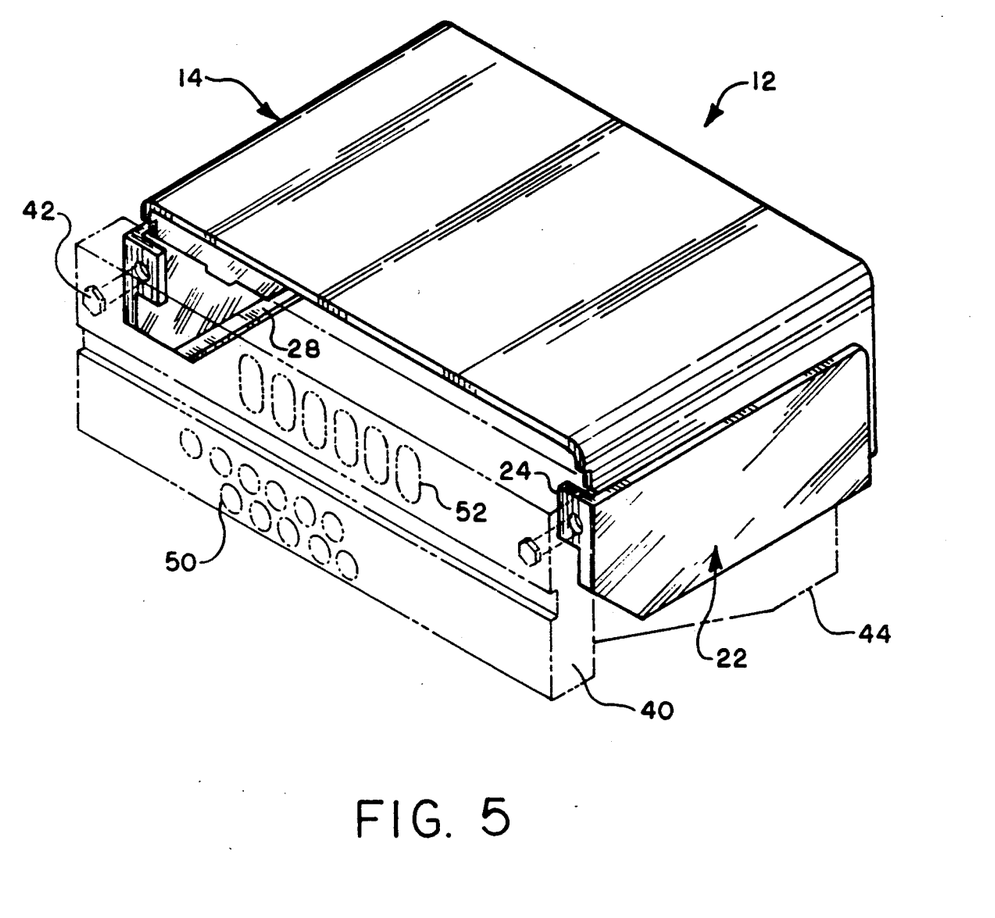
FIG. 5 is an isometric view of a protective cover of the invention mounted on a terminal block shown in phantom.

FIG. 5 is an isometric view of a protective cover of the invention mounted on a terminal block shown in phantom, generally 12. Details of the method of attachment of the mounting members 22 to the rear mounting panel 40 by means of a mounting fastener 42, for example a bolt, are to be seen. Wire access holes 52 to the interior of the terminal block, and ventilation holes 50 are also shown in phantom.

Figure 6:
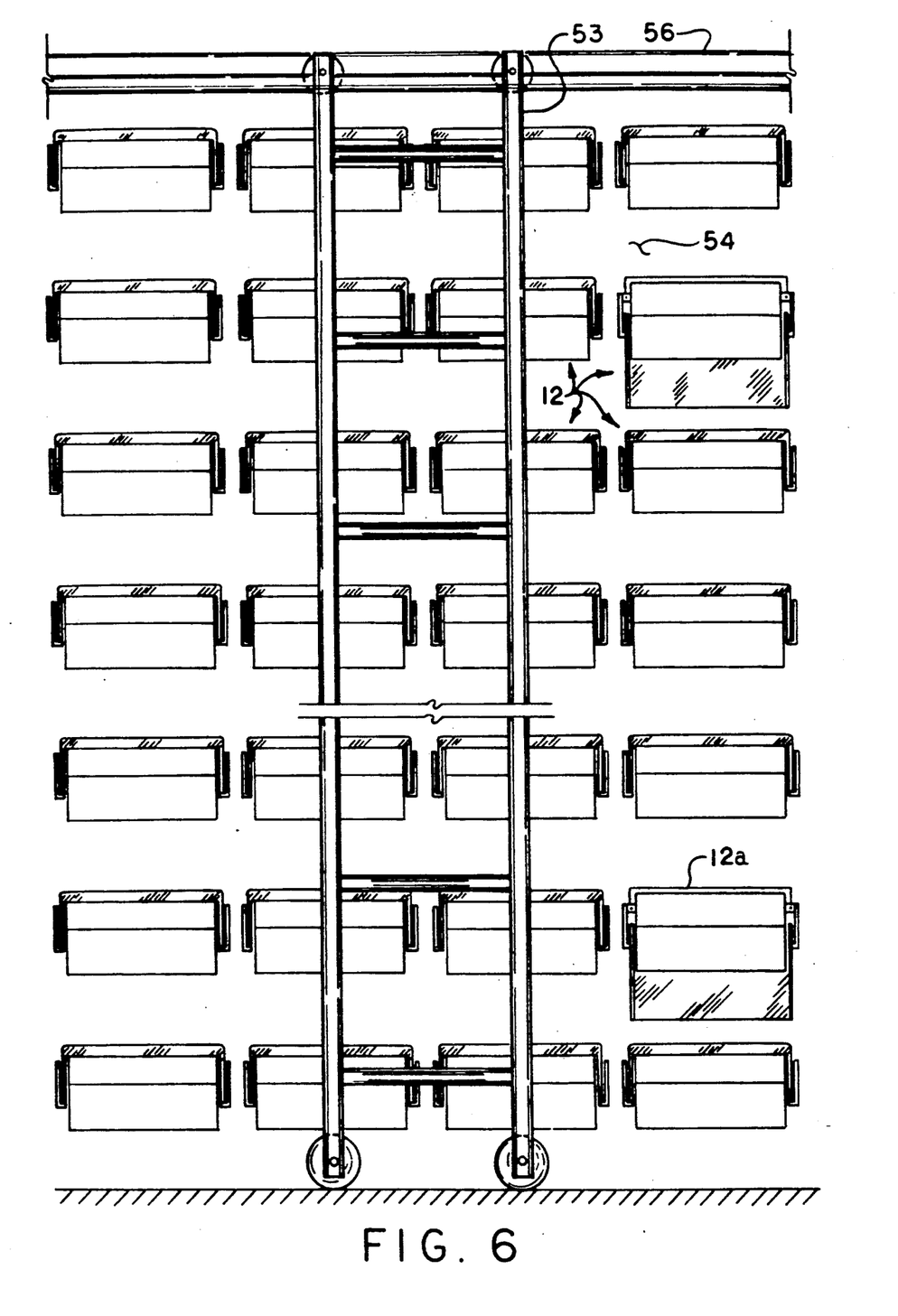
FIG. 6 shows an isometric view of terminal block assemblies as positioned in a distributing frame, having protective covers of the type contemplated by the invention mounted thereon.

FIG. 6 shows an isometric view of terminal blocks having protective covers of the type contemplated by the invention mounted thereon, as they are positioned in a distributing frame. In the Figure, terminal blocks with protective covers, generally 12, are shown in their closed position, and with 12a in an open position. The blocks are supported by connection to a distributing frame, illustrated in FIG. 7, and access to the upper blocks is provided by means of a ladder 53 adjustable to a position in front of the row of blocks of interest by moving the ladder along ladder track 56. The distributing frame 54 can be of any desired length, lengths of 100 feet, and longer being common, depending upon the number of blocks which must be located in a particular switch room. Further with respect of blocks dimensioned as described, the vertical distance between the block protective cover assemblies, will usually be about 6 inches, although greater spacing may be provided if desired, it being necessary to provide at least enough spacing to permit the pivot member to be swung in an arc to an open position.

Figure 7:
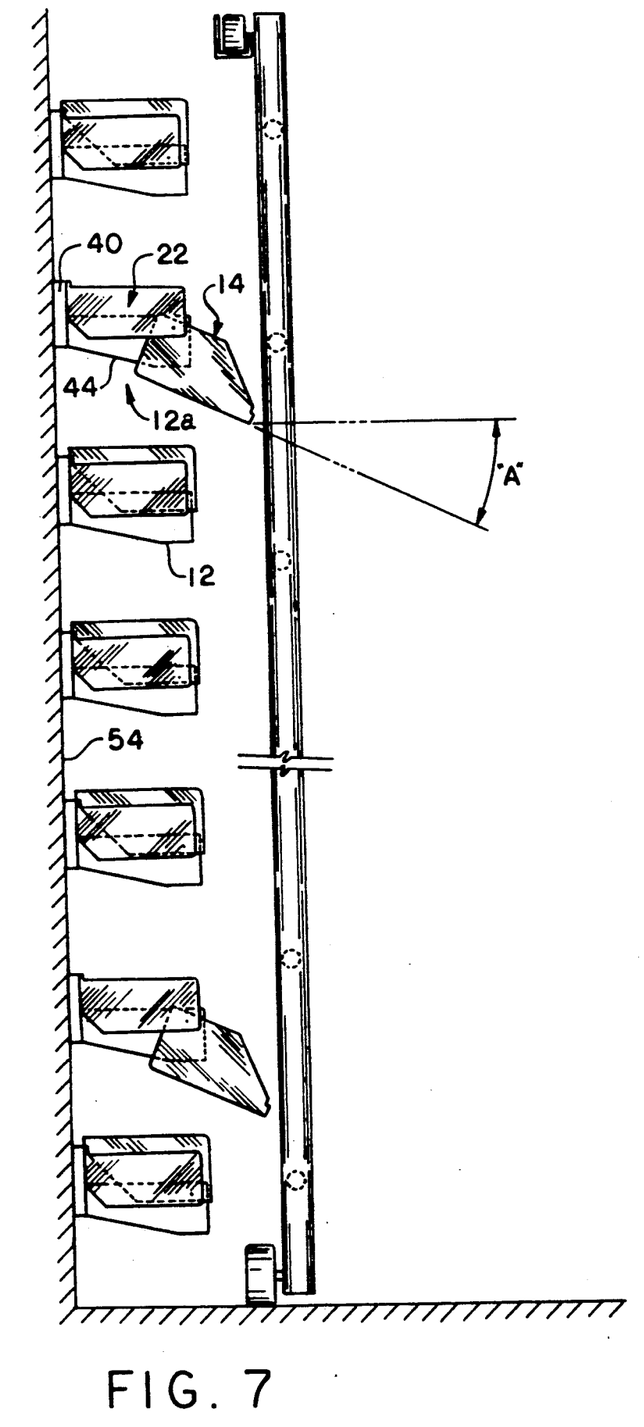
FIG. 7 is a side elevation of a distributing frame with covered terminal block assemblies mounted therein, and with a ladder associated therewith.

FIG. 7 is a side elevation of a distributing frame with covered terminal block assemblies mounted therein, and with a ladder associated therewith. As illustrated, the terminal blocks 44 provided with protective covers are connected to the distributing frame 54 by fastening rear panel 40 of the terminal block thereto. Some of the blocks are shown in their open position, 12a, while the others are illustrated in a closed position 12. In one of the open terminal block/protective cover assemblies shown, attention is drawn to angle "A" which the pivot member top 16 forms with the horizontal. The angle, determined by the location of the pivot pins, and by the height of the pivot member reinforcing flange 38 as particularly shown in FIG. 2, is especially important in instances where protective covers are being retrofitted onto terminal blocks previously installed on distributing frames located in relatively space-limited conditions. In such situations, the ladder 56 is located extremely closely to the front panels of the terminal blocks to conserve space, limiting the arc through which the pivot member top may swing during opening without interference with the ladder. It has been found that in most such installations, it is desirable to assure that when the terminal blocks are mounted in a horizontal position, the angle "A" which the top of the pivot member forms with the horizontal extends downwardly sufficiently far to avoid interference with the ladder as described. In a preferred embodiment of the invention, the protective cover is designed so that the pivot member top 16 forms an angle downwardly from the horizontal of at least 15°, a range from about 15° to about 25° normally being convenient.

While in accordance with the patent statutes, a preferred embodiment and best mode has been presented, the scope of the invention is not limited thereto, but rather is measured by the scope of the attached claims.

What is claimed is:

1. A protective cover for attachment over an electrical assembly unit to protect internal components located on an upper surface thereof, said unit having substantially vertical planar side, front, and rear panels in rectangular relationship to each other, comprising components which include:
   a pair of elongated, parallel, planar mounting members having a front end, a rear end, and upper and lower edges, each of which is mounted on said unit substantially parallel with opposite ones of said side panels, and
   a pivot member,
   said mounting members including:
      a first inwardly extending flange at the rear end thereof, having a first aperture extending therethrough dimensioned to receive fastener means for securing said mounting members to said rear panel;
      a second inwardly extending flange disposed along the lower edges of each of said mounting members, and
      an inwardly extending pin adjacent to the front of each of said mounting members, said pins being co-axial with each other,
   said pivot member having a generally planar top portion dimensioned to overlay the upper surface of said unit, and planar sidewalls extending downwardly therefrom parallel to said mounting members and to said side panels, and having a second aperture therein positioned and dimensioned to receive said pins, said pivot member being pivotable in a vertical plane about said pins between an open position facilitating access to said internal components of said unit, and a closed position providing protection for said components in which the lower edges of said sidewalls rest on said second flange of said mounting members.

2. A protective cover according to claim 1 wherein said electrical assembly unit is an electrical terminal block.

3. A protective cover according to claim 2 wherein a speed nut is positioned on each of said pins after their insertion through said second aperture, thereby securing said pins within said second aperture.

4. A protective cover according to claim 2 wherein said second apertures and said pins are so dimensioned relative to each other that frictional forces acting therebetween allow gravity to pivot said pivot member to said open position when said pivot member is pivoted beyond its center of gravity.

5. A protective cover according to claim 2 further comprising latch means for maintaining said pivot member in said closed position.

6. A plastic protective cover for attachment over an electrical terminal block assembly to protect internal components located on an upper surface thereof, said assembly having substantially vertical planar side, front, and rear panels in rectangular relationship to each other, and upper and lower surfaces, said cover comprising components which include:
   a pair of elongated, parallel, planar mounting members having a front end, a rear end and upper and lower edges, each of which is mounted on said assembly substantially parallel with adjacent opposite ones of said side panels, and
   a pivot member,
   said mounting members including:
      a first inwardly extending flange at the rear end thereof, having a first aperture extending therethrough dimensioned to receive fastener means for securing said mounting members to said rear panel;
      a second inwardly extending flange disposed along the lower edges of said mounting member, and
      an inwardly extending pin adjacent to the front of each of said mounting members, said pins being co-axial with each other,
   said pivot member having a generally planar top portion dimensioned to overlay the upper surface of said assembly, and planar sidewalls extending downwardly therefrom parallel to said mounting members and to said side panels, and having a second aperture therein positioned and dimensioned to receive said pins, said pivot member being pivotable in a vertical plane about said pins between an open position in which when said assembly is positioned horizontally, said top portion extends downwardly at an angle from the horizontal, thereby facilitating access to said internal components of said assembly, and a closed position, providing protection for said components in which the lower edges of said sidewalls rest on said second flange of said mounting members.

7. A protective cover for attachment over an electrical assembly unit to protect internal components located on an upper surface thereof, said unit having substantially vertical planar side, front, and rear panels in rectangular relationship to each other, comprising components which include:
   a pair of elongated, parallel, planar mounting members having a front end, a rear end, and upper and lower edges, each of which is mounted on said unit substantially parallel with opposite ones of said side panels, and a pivot member, said mounting members including:
- a first inwardly extending flange at the rear end thereof, having a first aperture extending therethrough dimensioned to receive fastener means for securing said mounting members to said rear panel;
- a second inwardly extending flange disposed along the lower edges of each of said mounting members, and
- an inwardly extending pin adjacent to the front of each of said mounting members, said pins being co-axial with each other, said pivot member having a generally planar top portion dimensioned to overlay the upper surface of said unit, and planar sidewalls extending downwardly therefrom parallel to said mounting members and to said side panels, and having a second aperture therein positioned and dimensioned to receive said pins, said pivot member being pivotable in a vertical plane about said pins between an open position facilitating access to said internal components of said unit, and a closed position providing protection for said components in which the lower edges of said sidewalls rest on said second flange of said mounting members, wherein said electrical assembly unit is an electrical terminal block, and when said unit is mounted horizontally, said top portion extends downwardly therefrom at an angle of at least about 15° from the horizontal and the protective cover is in its open position.

8. A protective cover for attachment over an electrical assembly unit to protect internal components located on an upper surface thereof, said unit having substantially vertical planar side, front, and rear panels in rectangular relationship to each other, comprising components which include:

a pair of elongated, parallel, planar mounting members having a front end, a rear end, and upper and lower edges, each of which is mounted on said unit substantially parallel with opposite ones of said side panels, and a pivot member, said mounting members including:
- a first inwardly extending flange at the rear end thereof, having a first aperture extending therethrough dimensioned to receive fastener means for securing said mounting members to said rear panel;
- a second inwardly extending flange disposed along the lower edges of each of said mounting members, and
- an inwardly extending pin adjacent to the front of each of said mounting members, said pins being co-axial with each other, said pivot member having a generally planar top portion dimensioned to overlay the upper surface of said unit, and planar sidewalls extending downwardly therefrom parallel to said mounting members and to said side panels, and having a second aperture therein positioned and dimensioned to receive said pins, said pivot member being pivotable in a vertical plane about said pins between an open position facilitating access to said internal components of said unit, and a closed position providing protection for said components in which the lower edges of said sidewalls rest on said second flange of said mounting members, wherein said electrical assembly unit is an electrical terminal block, and latch means are provided for maintaining said pivot member in said closed position, said latch means comprising an outwardly extending tab, and a detent secured by the locking engagement therewith, said tab and said detent being located opposite and adjacent to each other on the respective components to which they are attached, and where disengagement of said tab and said detent is achieved by the temporary deformation of at least one of said components by pressure applied thereto.

9. A protective cover for attachment over an electrical assembly unit to protect internal components located on an upper surface thereof, said unit having substantially vertical planar side, front, and rear panels in rectangular relationship to each other, comprising components which include:

a pair of elongated, parallel, planar mounting members having a front end, a rear end, and upper and lower edges, each of which is mounted on said unit substantially parallel with opposite ones of said side panels, and a pivot member, said mounting members including:
- a first inwardly extending flange at the rear end thereof, having a first aperture extending therethrough dimensioned to receive fastener means for securing said mounting members to said rear panel;
- a second inwardly extending flange disposed along the lower edges of each of said mounting members, and
- an inwardly extending pin adjacent to the front of each of said mounting members, said pins being co-axial with each other, said pivot member having a generally planar top portion dimensioned to overlay the upper surface of said unit, and planar sidewalls extending downwardly therefrom parallel to said mounting members and to said side panels, and having a second aperture therein positioned and dimensioned to receive said pins, said pivot member being pivotable in a vertical plane about said pins between an open position facilitating access to said internal components of said unit, and a closed position providing protection for said components in which the lower edges of said sidewalls rest on said second flange of said mounting members, wherein said electrical assembly unit is an electrical terminal block, and latch means are provided for maintaining said pivot member in said closed position, said latch means comprising an outwardly extending tab, and a detent secured by the locking engagement therewith, said tab and said detent being located opposite and adjacent to each other on the respective components to which they are attached, and where disengagement of said tab and said detent is achieved by the temporary deformation of at least one of said components by pressure applied thereto, and said protective cover is fabricated from a high-impact plastic.

* * * * *